(12) United States Patent
Higashino

(10) Patent No.: US 6,514,812 B2
(45) Date of Patent: Feb. 4, 2003

(54) STRUCTURE AND MANUFACTURING METHOD OF SEMICONDUCTOR DEVICE HAVING UNEVEN SURFACE AT MEMORY CELL CAPACITOR PART

(75) Inventor: Tomohiko Higashino, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/761,364

(22) Filed: Jan. 16, 2001

(65) Prior Publication Data
US 2001/0008789 A1 Jul. 19, 2001

(30) Foreign Application Priority Data
Jan. 19, 2000 (JP) .......................... 2000-014049

(51) Int. Cl.$^7$ ................ H01L 21/8242; H01L 21/336
(52) U.S. Cl. ............... 438/239; 438/243; 438/253; 257/68; 257/71; 257/296; 257/303; 257/306; 257/309
(58) Field of Search ........................... 438/239, 243, 438/253; 257/906, 68, 71, 296, 303, 306, 309

(56) References Cited
U.S. PATENT DOCUMENTS
5,468,670 A * 11/1995 Ryou

FOREIGN PATENT DOCUMENTS
KR 1999-018677 3/1999

* cited by examiner

Primary Examiner—Long Pham
Assistant Examiner—Khiem Nguyen
(74) Attorney, Agent, or Firm—Katten, Muchin, Zavis, Rosenman

(57) ABSTRACT

A structure and a manufacturing method of a semiconductor device composed of 1T1Cs, in which a surface area of a memory cell capacitor part is expanded by forming an uneven surface at the memory cell capacitor part, is provided. Further, an additional photo lithography process is not required at expanding the surface area, and the manufacturing efficiency is not decreased. At the manufacturing method of the semiconductor device, two kinds of spaces whose sizes are different are formed in a conductive layer by that a part of a first oxide film and a part of the conductive layer to its middle part are removed. After this, a second oxide film is formed on the whole surface so that a small space of the spaces is filled with the second oxide film and side walls are formed on the side surfaces of a large space by applying etching back. With this, an exposed part of the conductive layer is formed selectively, and this exposed part of the conductive layer is removed by the etching. After this, the remaining first and second oxide films are removed. With processes mentioned above, the uneven surface at the memory cell capacitor part is formed.

6 Claims, 4 Drawing Sheets

STRUCTURE AND MANUFACTURING METHOD OF SEMICONDUCTOR DEVICE HAVING UNEVEN SURFACE AT MEMORY CELL CAPACITOR PART

BACKGROUND OF THE INVENTION

The present invention relates to a structure and a manufacturing method of a semiconductor device composed of 1T1Cs (one transistor one capacitor), in particular, in which the surface area of a memory cell capacitor part is expanded in order to increase capacitance per bit, and also manufacturing efficiency is not made to decrease.

DESCRIPTION OF THE RELATED ART

Recently, at a semiconductor device such as a DRAM, a stacked capacitor type memory cell structure, in which a memory cell capacitor part is stacked up, has been used. Generally, capacitance of a memory cell is in proportion to the surface area of the memory cell capacitor part, and is inverse proportion to the thickness of the dielectric film. Therefore, in order to increase the capacitance of the memory cell, it is desirable to expand the surface area of the memory cell capacitor part.

On the other hand, the size of the memory cell has been largely reduced corresponding to large scale integration of a DRAM. Consequently, at a capacitor forming region, its plane occupying area has been also reduced. For example, at a semiconductor device, whose line width is less than 0.28 $\mu$m, manufactured by a micro process, the occupying area of the memory cell capacitor part is very narrow. As a result, the capacitance of the memory cell is decreased and the deterioration of the electric charge hold characteristic is generated. Therefore, in a technical trend that the semiconductor device is manufactured by a further micro process, a method, in which the capacitance of the memory cell is increased efficiently, has been required.

Referring to drawings, a conventional manufacturing method of a semiconductor device is explained. In the drawings, in order to make the explanation concise, manufacturing processes are divided into a few processes expediently. FIG. 1 is a diagram showing a first process at the conventional manufacturing method of the semiconductor device. As shown in FIG. 1, at the semiconductor device composed of the 1T1Cs, an impurity diffusion layer 11, in which a source and a drain of a transistor are formed, is formed on the surface of a semiconductor substrate (not shown). On this impurity diffusion layer 11, an interlayer 12 and an interlayer 13 being different from the interlayer 12 are formed. An anisotropic dry etching is applied to the interlayer 12 and the interlayer 13 by using resist as a mask, and a contact hole reaching to the impurity diffusion layer 11 is formed. After this, the contact hole is filled with a conductive layer 14 (DOPOS or Poly-Si) and the conductive layer 14 is formed on the interlayer 13.

FIG. 2 is a diagram showing a second process at the conventional manufacturing method of the semiconductor device. As shown in FIG. 2, the anisotropic dry etching is applied to the conductive layer 14 by using resist 16 as a mask, and a lower electrode of a memory cell capacitor part is formed. FIG. 3 is a diagram showing a third process at the conventional manufacturing method of the semiconductor device. A final completed shape of the lower electrode of the memory cell capacitor part is shown in FIG. 3. And a rectangular solid pattern at a cross sectional view separating each of memory cell capacitor parts is formed by the conductive layer 14 by applying the anisotropic dry etching.

The amount of electric charge storing in a memory cell capacitor part by data writing of one bit is proportion to the surface area of the conductive layer 14 (DOPOS or Poly-Si) on the interlayer 13 shown in FIG. 3. In order to increase the capacitance, the surface area of the conductive layer 14 is required to be as large as possible. In order to from a memory cell capacitor part whose surface area is expanded, a photo lithography process will be applied additionally. However, in case that this photo lithography process is added to the manufacturing processes of the semiconductor device, this manufacturing processes are made to be inefficient.

SUMMARY OF THE INVENTION

It is therefore an object of the present invention to provide a structure and a manufacturing method of a semiconductor device composed of 1T1Cs, in which the surface area of a memory cell capacitor part is expanded by forming an uneven surface on the surface of a lower electrode of the memory cell capacitor part in order to increase the capacitance of the memory cell per bit. And further, at manufacturing processes, a photo lithography process is not additionally required to manufacture the semiconductor device at the process that the lower electrode having the uneven surface is formed, therefore the manufacturing efficiency is not decreased.

According to a first aspect of the present invention for achieving the object mentioned above, there is provided a manufacturing method of a semiconductor device, in which at least a conductive layer is formed on an impurity diffusion layer in which a source and a drain of at least one transistor are formed, and a lower electrode of a memory cell capacitor part of a stacked capacitor type memory cell composed of 1T1C (one transistor one capacitor) is formed by removing a part of the conductive layer. The manufacturing method provides the steps of, forming a first insulation film on the conductive layer, applying a first etching for removing a part of the first insulation film and a part of the conductive layer to its middle part, and forming spaces being different sizes, forming a second insulation film on the whole surface formed by mentioned above steps so that a small size space of the spaces is filled with the second insulation film, applying an etching back for forming an exposed part of the conductive layer at a large size space of the spaces, and applying a second etching for removing the conductive layer at the exposed part of the conductive layer.

According to a second aspect of the present invention, in the first aspect, the conductive layer is made of Poly-Si, and the second etching is an anisotropic Poly-Si dry etching.

According to a third aspect of the present invention, in the first aspect, the first insulation film and the second insulation film are formed by an oxide film, the etching back is executed by an anisotropic oxide film dry etching, at the large space, the exposed part of the conductive layer is formed by that side walls of the oxide film are formed on side surfaces of the large space, and at the small space, a side wall of the oxide film is formed on a side surface of the small space, but the width of the side wall at the small space is almost equal to the width of the side wall at the large space, and the size of the small space is smaller than that of the large space, therefore the small space is completely filled with the side wall formed by the oxide film.

According to a fourth aspect of the present invention, in the first aspect, at forming the second insulation film, the thickness of the second insulation film is a half size of the horizontal direction size of the small space.

According to a fifth aspect of the present invention, in the first aspect, the first etching step provides a photo lithography process, and based on a resist pattern having different widths transferred on the upper surface of the first insulation film by the photo lithography process, a part of the first insulation film and a part of the conductive layer to its middle part are removed, and the spaces being different sizes are formed.

According to a sixth aspect of the present invention, in the first aspect, a manufacturing method of a semiconductor device further provides the step of, applying a third etching for removing remaining the first and second insulation films being oxide films by an oxide film wet etching after the second etching step.

According to a seventh aspect of the present invention, there is provided a structure of a semiconductor device, in which at least a conductive layer is formed on an impurity diffusion layer in which a source and a drain of at least one transistor are formed, and a lower electrode of a memory cell capacitor part of a stacked capacitor type memory cell composed of 1T1C (one transistor one capacitor) is formed by removing a part of the conductive layer. At the structure of the semiconductor device, the lower electrode provides two kinds of spaces at the conductive layer. And one of the two kinds of spaces is a small space and is disposed at the center part in the conductive layer, and the other of the two kinds of spaces is a large space and is disposed at the outer part in the conductive layer in a state that side surfaces of the large space have a difference in level at its middle part and the bottom surface of the large space reaches to an interlayer. Therefore, the surface of the lower electrode has an uneven surface by the structure mentioned above.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 1:
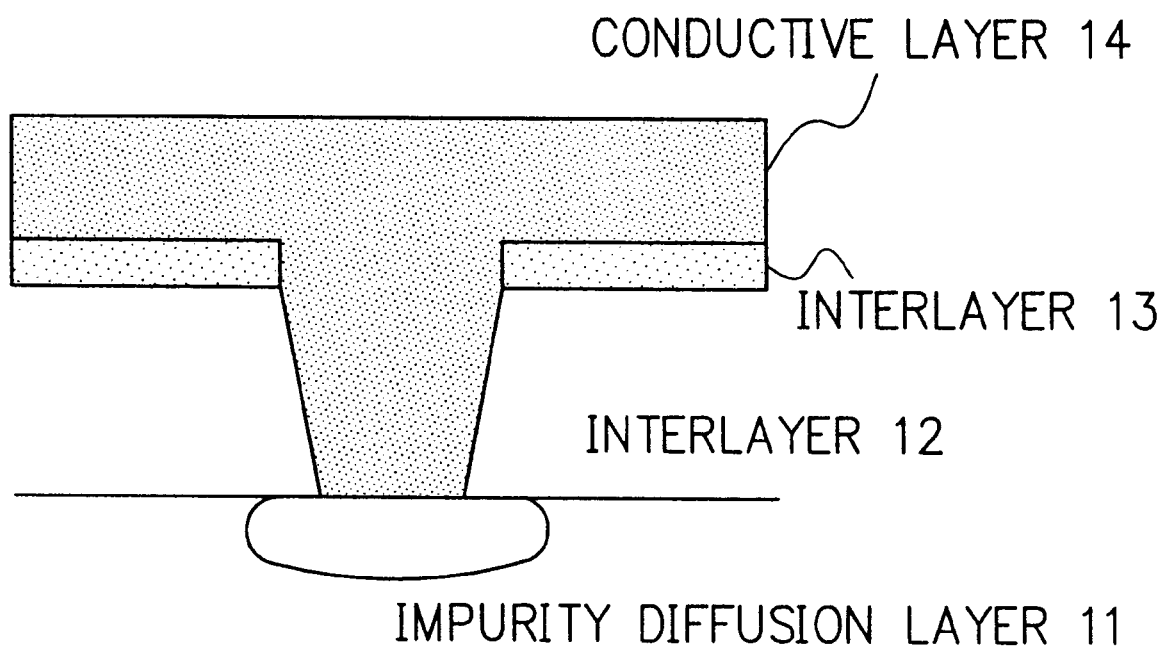
FIG. 1 is a diagram showing a first process at a conventional manufacturing method of a semiconductor device.
Figure 2:
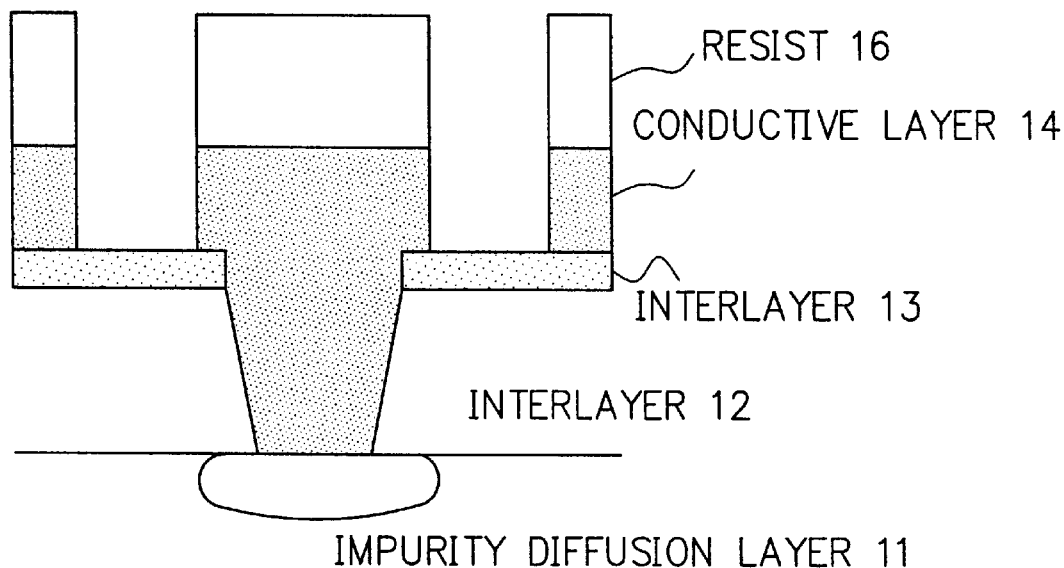
FIG. 2 is a diagram showing a second process at the conventional manufacturing method of the semiconductor device.
Figure 3:
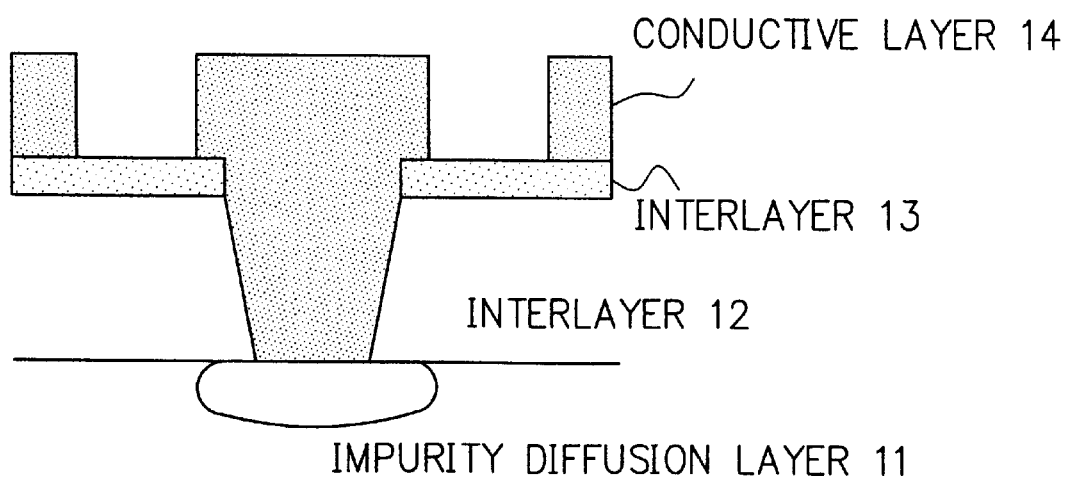
FIG. 3 is a diagram showing a third process at the conventional manufacturing method of the semiconductor device.
Figure 4:
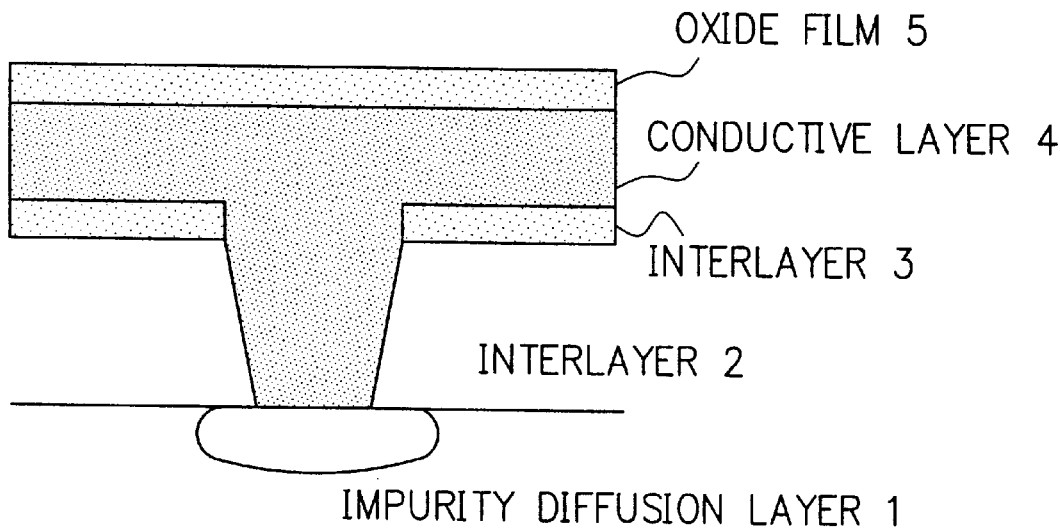
FIG. 4 is a diagram showing a first process at an embodiment of a manufacturing method of a semiconductor device of the present invention.

Referring now to the drawings, an embodiment of the present invention is explained in detail. In the drawings, in order to make the explanation concise, manufacturing processes are divided into several processes expediently. FIG. 4 is a diagram showing a first process at the embodiment of a manufacturing method of a semiconductor device of the present invention. As shown in FIG. 4, at the semiconductor device composed of the 1T1Cs, an impurity diffusion layer 1, in which a source and a drain of a transistor are formed, is formed on the surface of a semiconductor substrate (not shown). On this impurity diffusion layer 1, an interlayer 2 and an interlayer 3 being different from the interlayer 2 are formed. An anisotropic dry etching is applied to the interlayer 2 and the interlayer 3 by using resist as a mask, and a contact hole reaching to the impurity diffusion layer 1 is formed. After this, the contact hole is filled with a conductive layer 4 (DOPOS or Poly-Si), and further an oxide film 5 is formed on the conductive layer 4.

Figure 5:
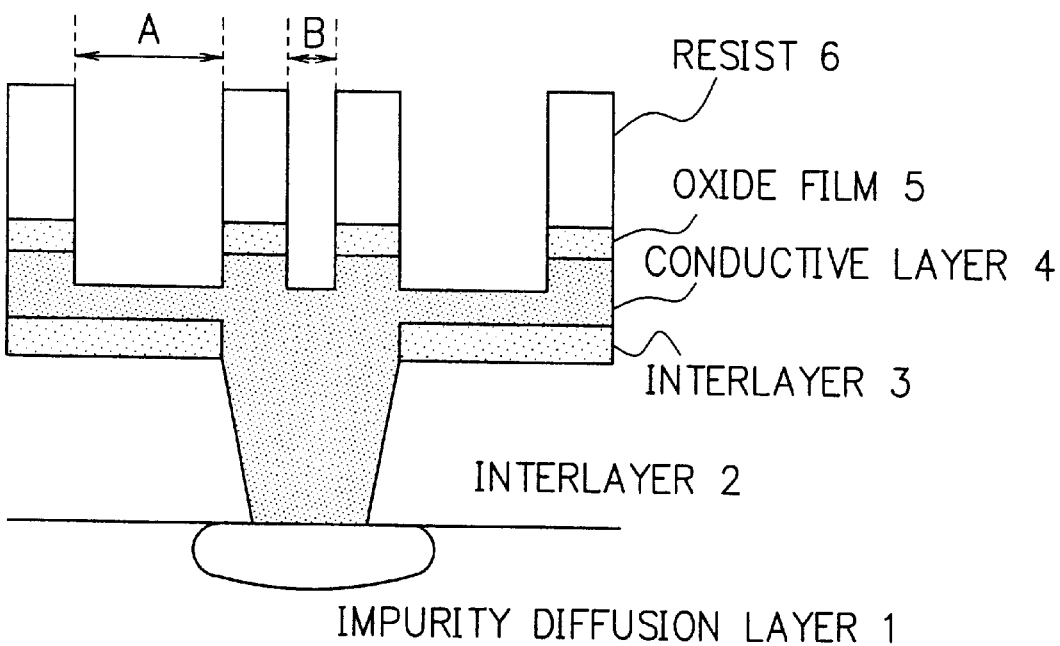
FIG. 5 is a diagram showing a second process at the embodiment of the manufacturing method of the semiconductor device of the present invention.

FIG. 5 is a diagram showing a second process at the embodiment of the manufacturing method of the semiconductor device of the present invention. As shown in FIG. 5, a photo lithography process and the anisotropic dry etching are applied to the oxide film 5 and to the middle part of the conductive layer 4 by using resist 6 as a mask, and spaces A and B whose sizes are different from each other are formed. At this time, the relation between the space A separating each of the memory cell capacitor parts and the space B to be formed inside of the memory cell capacitor part is required to be A>B.

Figure 6:
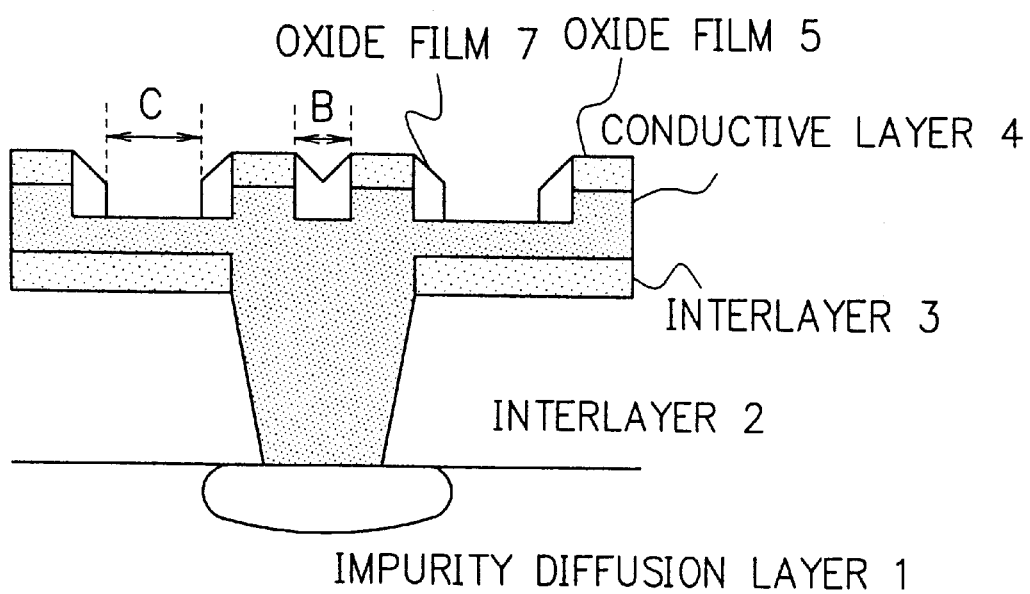
FIG. 6 is a diagram showing a third process at the embodiment of the manufacturing method of the semiconductor device of the present invention.

FIG. 6 is a diagram showing a third process at the embodiment of the manufacturing method of the semiconductor device of the present invention. As shown in FIG. 6, an oxide film 7 is formed on the conductive layer 4, by a process that the space B is filled with the oxide film 7, for example, by that the thickness of the oxide film 7 is a half thickness of the horizontal direction size of the space B. After this, an etching back process is applied to the whole surface of a wafer by an anisotropic oxide film dry etching. With this, side walls are formed in the spaces A and B, in a state that the widths of the side walls are almost the same. At this time, since A>B, the space B is completely filled with the side wall, however the space A is wider than the space B, consequently, the space A is not filled with the side wall, and a space C being a window is formed at the space A.

Figure 7:
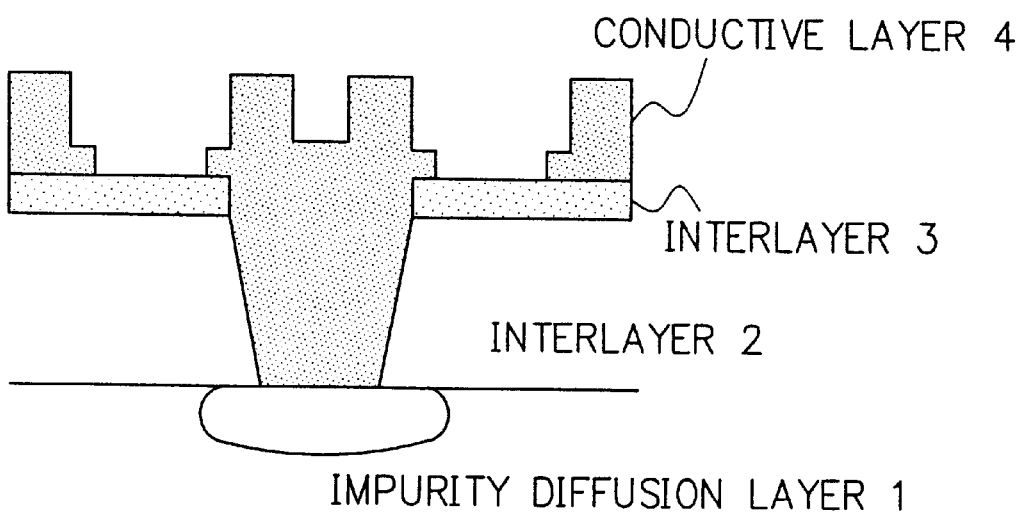
FIG. 7 is a diagram showing a fourth process at the embodiment of the manufacturing method of the semiconductor device of the present invention.

FIG. 7 is a diagram showing a fourth process at the embodiment of the manufacturing method of the semiconductor device of the present invention. As shown in FIG. 7, an anisotropic Poly-Si dry etching is applied to the whole surface of the wafer. That is, the etching is applied to the conductive layer 4 selectively at the lower part of the window being the space C and at the other parts of the wafer. With this, a deep trench of, for example, 1000 angstroms is formed at the lower part of the window being the space C. Consequently, the space A separating each of the memory cell capacitor parts has a shape being an uneven surface, and the surface area of the memory cell capacitor part is increased by the uneven surface, and the capacitance of the memory cell is increased. After applied the anisotropic Poly-Si dry etching, the remaining oxide films 5 and 7 are removed by an oxide film wet etching.

At the embodiment of the present invention, the photo lithography process is required to form the memory cell capacitor part, this is the same at the conventional manufacturing method. However, at the embodiment of the present invention, without adding a new photo lithography process for forming the uneven surface at the surface of the memory cell capacitor part, the uneven surface can be formed on the surface of the memory cell capacitor part.

Further, at the conventional manufacturing method, in which a pattern is directly formed on the conductive layer 14 by using the resist 16 and the etching is applied, for example, only a space being a simple shape such as a rectangular solid at a cross sectional view is formed, and a fine process, in which a space having an uneven surface is formed, can not be executed.

Therefore, at the conventional manufacturing method, in which the pattern is directly formed on the conductive layer 14 by using the resist 16 and the etching is applied, there are two methods that expands the surface area of the memory cell capacitor part without adding the photo lithography process. One is that an area occupying the memory cell capacitor part per bit is increased, and the other is that the height of the conductive layer 14 is made to be higher. However, making the area expand is not possible due to its large scale integration. And making the height of the conductive layer 14 higher causes that the aspect ratio of the contact hole forming at the following process is made to be large, therefore, this method is impossible when its characteristics are considered.

At the manufacturing method of the present invention, the oxide film 5 is formed on the conductive layer 4, and further two kinds of spaces whose shapes are different from each other are formed. With this, as shown in FIG. 6, an exposing part of the conductive layer 4 can be formed selectively at the upper surface of the conductive layer 4, and a space having an uneven surface on its side surfaces can be easily formed on the conductive layer 4 by the anisotropic Poly-Si dry etching at the following process.

Furthermore, at the manufacturing method of the present invention, the oxide film 5 is formed on the surface of the memory cell capacitor part beforehand, therefore, a part of the oxide film 5 remains even after the etching back is applied to the side walls by the anisotropic oxide film dry etching. Therefore, the conductive layer 4 can be protected by the remaining oxide film 5, when the anisotropic Poly-Si dry etching is applied to the whole surface of the wafer for separating the memory cell capacitor parts. After applied the anisotropic Poly-Si dry etching, the remaining oxide films 5 and 7 are removed by an oxide film wet etching.

According to the present invention, the lower electrode of the memory cell capacitor part is manufacture by the method mentioned above. Therefore without expanding the plane occupying area of the memory cell capacitor part per bit and without adding the photo lithography process, the memory cell capacitor part whose surface area is expanded can be formed. With this, the memory cell capacitance can be increased to 35 fF from 28 fF.

As mentioned above, according to the present invention, at the structure and the manufacturing method of the semiconductor device composed of the 1T1Cs, in which the lower electrode of the memory cell capacitor part of the stacked capacitor type memory cell is formed, in order to increase the memory cell capacitance per bit, the surface area of the memory cell capacitor part can be expanded by that an uneven surface is formed on the surface of the lower electrode of the memory cell capacitor part. Furthermore, when the lower electrode of the memory cell capacitor part is formed, an additional photo lithography process is not required, therefore lowering the manufacturing efficiency of the semiconductor device can be prevented.

While the present invention has been described with reference to the particular illustrative embodiment, it is not to be restricted by that embodiment but only by the appended claims. It is to be appreciated that those skilled in the art can change or modify the embodiment without departing from the scope and spirit of the present invention.

What is claimed is:

1. A manufacturing method of a semiconductor device, in which at least a conductive layer is formed on an impurity diffusion layer in which a source and a drain of at least one transistor are formed, and a lower electrode of a memory cell capacitor part of a stacked capacitor type memory cell composed of one transistor and one capacitor is formed by removing a part of said conductive layer, comprising the steps of:

forming a first insulation film on said conductive layer;

applying a first etching for removing a part of said first insulation film and a part of said conductive layer to its middle part, for forming spaces of different sizes;

forming a second insulation film on the whole surface formed by mentioned above steps so that a small size space of said spaces is filled with said second insulation film;

applying an etching back for forming an exposed part of said conductive layer at a large size space of said spaces; and applying a second etching for removing said conductive layer at said exposed part of said conductive layer.

2. A manufacturing method of a semiconductor device in accordance with claim 1, wherein:

said conductive layer is made of Poly-Si, and said second etching is an anisotropic Poly-Si dry etching.

3. A manufacturing method of a semiconductor device in accordance with claim 1, wherein:

said first insulation film and said second insulation film are formed by an oxide film;

said etching back is executed by an anisotropic oxide film dry etching;

at said large space, said exposed part of said conductive layer is formed by that side walls of said oxide film are formed on side surfaces of said large space; and at said small space, a side wall of said oxide film is formed on a side surface of said small space, but the width of said side wall at said small space is almost equal to the width of said side wall at said large space, and the size of the small space is smaller than that of the large space, therefore said small space is completely filled with said side wall formed by said oxide film.

4. A manufacturing method of a semiconductor device in accordance with claim 1, wherein:

at forming said second insulation film, the thickness of said second insulation film is a half size of the horizontal direction size of said small space.

5. A manufacturing method of a semiconductor device in accordance with claim 1, wherein:

said first etching step comprises a photo lithography process, and based on a resist pattern having different widths transferred on the upper surface of said first insulation film by said photo lithography process, a part of said first insulation film and a part of said conductive layer to its middle part are removed, and said spaces being different sizes are formed.

6. A manufacturing method of a semiconductor device in accordance with claim 1, further comprising the step of:

applying a third etching for removing remaining said first and second insulation films being oxide films by an oxide film wet etching after said second etching step.

* * * * *